United States Patent
Kakuishi et al.

(10) Patent No.: US 10,645,818 B2
(45) Date of Patent: May 5, 2020

(54) SOLDERING METHOD

(71) Applicant: Senju Metal Industry Co., Ltd., Tokyo (JP)

(72) Inventors: Mamoru Kakuishi, Tochigi (JP); Ryuji Ukai, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 16/462,719

(22) PCT Filed: Nov. 6, 2017

(86) PCT No.: PCT/JP2017/039984
§ 371 (c)(1),
(2) Date: May 21, 2019

(87) PCT Pub. No.: WO2018/096917
PCT Pub. Date: May 31, 2018

(65) Prior Publication Data
US 2019/0373741 A1    Dec. 5, 2019

(30) Foreign Application Priority Data

Nov. 22, 2016  (JP) ................................. 2016-226419

(51) Int. Cl.
*B23K 31/02* (2006.01)
*H05K 3/34* (2006.01)
(Continued)

(52) U.S. Cl.
CPC ........... *H05K 3/3463* (2013.01); *B23K 1/008* (2013.01); *B23K 1/0016* (2013.01); *B23K 31/02* (2013.01);
(Continued)

(58) Field of Classification Search
CPC .. H05K 3/3463; B23K 35/0244; B23K 31/02; B23K 35/38; B23K 35/262; B23K 1/008;
(Continued)

(56) References Cited

U.S. PATENT DOCUMENTS 5,121,875 A * 6/1992 Hagerty ................. B23K 1/085
228/219
5,139,193 A * 8/1992 Todd ...................... B23K 1/012
228/180.21
(Continued)

FOREIGN PATENT DOCUMENTS

CN      101682998 A     3/2010
DE   102009028865 A1    3/2011
(Continued)

OTHER PUBLICATIONS

Machine translation of JP-2006167735A (no date available).*
Machine translation of JP-20150826630A (no date available).*

*Primary Examiner* — Kiley S Stoner
(74) *Attorney, Agent, or Firm* — The Webb Law Firm

(57) ABSTRACT

A solder scattering is prevented at the time of reflow and the oxide films formed on the surfaces of solder or electrodes are thoroughly removed. The soldering method according to the present invention contains the steps of: applying solder paste to the electrode on a printed circuit board and mounting an electronic part on the solder paste, volatilizing the residue-free flux contained in the solder paste by heating the printed circuit board in a chamber set to be a vacuum state and approximately 180 degree C. at the time of pre-heating (interval A), removing oxide films formed on the electrode and the like by heating the printed circuit board in the chamber set to be a formic acid atmospheric state and the temperature of approximately 200 degree C. at the time of reducing (interval B), and melting solder powder contained in the solder paste by heating the printed circuit board in the
(Continued)

chamber set to be a vacuum state and the temperature of 250 degree C. at the time of main heating (interval C).

4 Claims, 2 Drawing Sheets

(51) Int. Cl.
  B23K 1/008 (2006.01)
  B23K 35/02 (2006.01)
  B23K 35/26 (2006.01)
  B23K 35/38 (2006.01)
  B23K 1/00 (2006.01)
  B23K 103/12 (2006.01)
  B23K 101/42 (2006.01)
  C22C 13/00 (2006.01)

(52) U.S. Cl.
  CPC ........ B23K 35/0244 (2013.01); B23K 35/262 (2013.01); B23K 35/38 (2013.01); *B23K 2101/42* (2018.08); *B23K 2103/12* (2018.08); *C22C 13/00* (2013.01)

(58) Field of Classification Search
  CPC ...... B23K 2103/12; B23K 2101/36–42; B23K 35/025; B23K 3/0638; B23K 1/0016; C22C 13/00
  USPC ............... 228/248.1–248.5, 220–221, 233.2; 148/23–24
  See application file for complete search history.

(56) References Cited

U.S. PATENT DOCUMENTS

| | | | |
|---|---|---|---|
| 5,776,551 A | 7/1998 | Pasch | |
| 6,409,070 B1* | 6/2002 | Master | B23K 1/203 228/102 |
| 6,471,115 B1* | 10/2002 | Ijuin | B23K 1/0016 228/180.22 |
| 10,272,527 B2 | 4/2019 | Ueshima et al. | |
| 2003/0047591 A1* | 3/2003 | Dong | B23K 1/20 228/220 |
| 2003/0178474 A1* | 9/2003 | Jiang | H01L 21/563 228/205 |
| 2004/0226914 A1* | 11/2004 | Dong | B08B 7/00 216/67 |
| 2007/0131736 A1* | 6/2007 | Dong | B23K 1/206 228/220 |
| 2007/0228115 A1 | 10/2007 | Inomata et al. | |
| 2010/0025091 A1 | 2/2010 | Ferdinandi et al. | |
| 2013/0187547 A1* | 7/2013 | Dong | B23K 1/20 315/111.81 |
| 2014/0138818 A1* | 5/2014 | Aleksov | H01L 24/81 257/737 |
| 2015/0027589 A1* | 1/2015 | Okada | B23K 35/3613 148/24 |
| 2016/0181217 A1* | 6/2016 | Prack | H01L 24/11 438/613 |
| 2017/0053960 A1* | 2/2017 | Wakiyama | H01L 23/3192 |
| 2017/0100802 A1* | 4/2017 | Kobayashi et al. | |
| 2017/0179096 A1* | 6/2017 | Dang | H01L 25/50 |
| 2017/0207193 A1* | 7/2017 | Bower | H01L 24/75 |
| 2019/0009375 A1 | 1/2019 | Hayashi et al. | |
| 2019/0326344 A1* | 10/2019 | Wakiyama | H01L 24/11 |

FOREIGN PATENT DOCUMENTS

| | | |
|---|---|---|
| JP | 4220166 A | 8/1992 |
| JP | 200425305 A | 1/2004 |
| JP | 2005271059 A | 10/2005 |
| JP | 2006167735 A | 6/2006 |
| JP | 2007109859 A | 4/2007 |
| JP | 2008172120 A | 7/2008 |
| JP | 201582630 A | 4/2015 |
| WO | 2015146999 A1 | 10/2015 |
| WO | 2015152387 A1 | 10/2015 |
| WO | 2017057651 A1 | 4/2017 |

* cited by examiner

SOLDERING METHOD

CROSS-REFERENCE TO RELATED APPLICATIONS

This application is the United States national phase of International Application No. PCT/JP2017/039984 filed Nov. 6, 2017, and claims priority to Japanese Patent Application No. 2016-226419 filed Nov. 22, 2016, the disclosures of which are hereby incorporated by reference in their entirety.

TECHNICAL FIELD

The present invention relates to a soldering method of soldering electronic parts onto a printed circuit board.

BACKGROUND

In general, when soldering each electronic part to an electrode (soldering portion) on a printed circuit board, solder paste is applied to the electrode on the printed circuit board by a printing method or a discharge method, and then the electronic part is soldered on the printed circuit board by pre-heating and main heating the printed circuit board in a chamber of reflow device.

The solder paste is made of a bonding material which solder powder is mixed with a flux. In recent years, residue-free solder paste where a cleaning step of flux residue in the soldering portion is unnecessary after reflowing is widely available in the semiconductor field, the automotive industry and the like. For example, Patent Document 1 discloses residue-free solder paste comprising a solid solvent which is solid at room temperature and which vaporizes at a reflow soldering temperature, a highly viscous solvent which is a highly viscous fluid at room temperature and which vaporizes at the reflow soldering temperature, and a liquid solvent which is liquid at room temperature and which vaporizes at the reflow soldering temperature as a balance.

In addition, as a measure against flux residue, the technology where an electronic part is soldered on the printed circuit board by using a fluxless preform material has been known other than the use of residue-free solder paste mentioned above. For example, Patent Document 2 discloses a power module where a fluxless solder preform material is used in bonding a semiconductor element to an insulating metal board. In this case, the reflow is conducted in a reducing atmosphere due to the use of the fluxless preform material.

PRIOR ART DOCUMENTS

Patent Documents

Patent Document 1: Japanese Patent Application Publication No. 2004-025305
Patent Document 2: Japanese Patent Application Publication No. 2008-172120

SUMMARY OF THE INVENTION

Problems to be Solved by the Invention

However, the following issues arise in the soldering method disclosed in Patent Document 1 mentioned above. That is, in the soldering method disclosed in Patent Document 1, solder is melted under an atmospheric pressure or under a nitrogen atmosphere, with the state where flux remains in the main heating time, and therefore the flux is scattered in melting the solder and this may lead to a solder scattering by the force of the flux scattering, as well. It is conceivable that the reason of the flux scattering lies on the remains of solvent components contained in the flux.

Accordingly, the present invention addresses the above-mentioned issues and has an object to provide a soldering method that can prevent solder from scattering at the time of reflow, and can thoroughly remove oxide films formed on the surface of solder or electrodes.

Means for Solving the Problems

The soldering method according to the present invention comprises a first step of applying solder paste in which a solder alloy is mixed with residue-free flux to a soldering portion on a circuit board, and mounting an electronic part on the solder paste, a second step of volatilizing the residue-free flux contained in the solder paste by heating the circuit board in a furnace set to be a vacuum state and a first temperature, a third step of removing an oxide film on at least the soldering portion by heating the circuit board in the furnace set to be a reducing atmospheric state and a second temperature, and a fourth step of melting solder contained in the solder paste by heating the circuit board in the furnace set to be a vacuum state and a third temperature which is higher than the second temperature.

Effects of the Invention

According to the present invention, the solder scattering can be prevented at the time of reflow and the oxide films formed on the surface of solder or electrodes can be thoroughly removed.

EMBODIMENTS FOR CARRYING OUT THE INVENTION

The following will describe preferred embodiments of the present invention more in detail with reference to the drawings.

Example of Steps in the Soldering Method

Figure 1A:
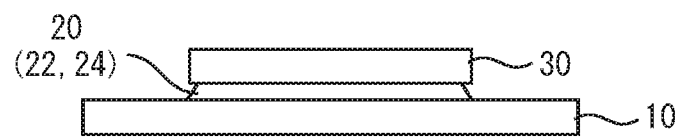
FIG. 1A is a diagram for showing an example of a step in a soldering method according to the embodiment of the present invention.

FIGS. 1A through 1D show an example of the manufacturing steps of a semiconductor device in the soldering method according to the present invention. FIG. 2 shows an example of the relationship between temperature and atmospheric pressure (temperature profile) in a chamber at the time of reflow. In FIG. 2, a left-hand vertical axis indicates the temperature in the chamber, a right-hand vertical axis indicates the pressure in the chamber and a horizontal axis indicates the amount of time.

A reflow device 100 in the present embodiment is the reflow device where the soldering is conducted by using the reduction of formic acid. In addition, the reflow device utilizing the reduction of formic acid is known, and therefore a detailed description will be omitted.

At first, a metal mask is prepared, where openings are formed in the area that corresponds to an area of electrodes (soldering portions) on a printed circuit board 10, and the openings of the metal mask are aligned to the electrodes on the printed circuit board 10, and then the metal mask is placed on the printed circuit board 10. Subsequently, solder paste 20 placed on the metal mask is filled to the openings of the metal mask by moving a squeegee. The solder paste 20 is used, where a solder alloy having a composition of Sn-3.0Ag-0.5Cu is mixed with residue-free flux, for example. The solder paste 20 corresponding to any size of electrode and the like can be formed by adjusting the opening dimension or thickness of the metal mask. Subsequently, as shown in FIG. 1A, each electronic part 30 is placed on the solder paste 20 after removing the metal mask from the printed circuit board 10 (First Step).

Figure 1B:
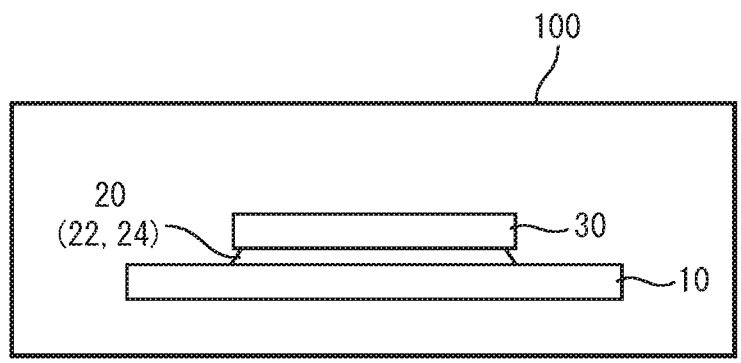
FIG. 1B is a diagram for showing an example of a step in the soldering method according to the embodiment of the present invention.
Figure 1C:
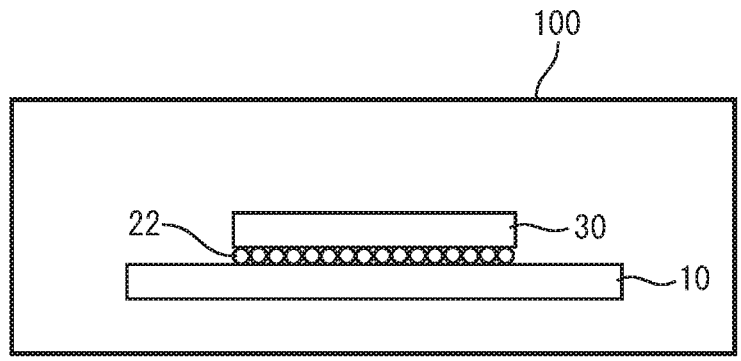
FIG. 1C is a diagram for showing an example of a step in the soldering method according to the embodiment of the present invention.
Figure 2:
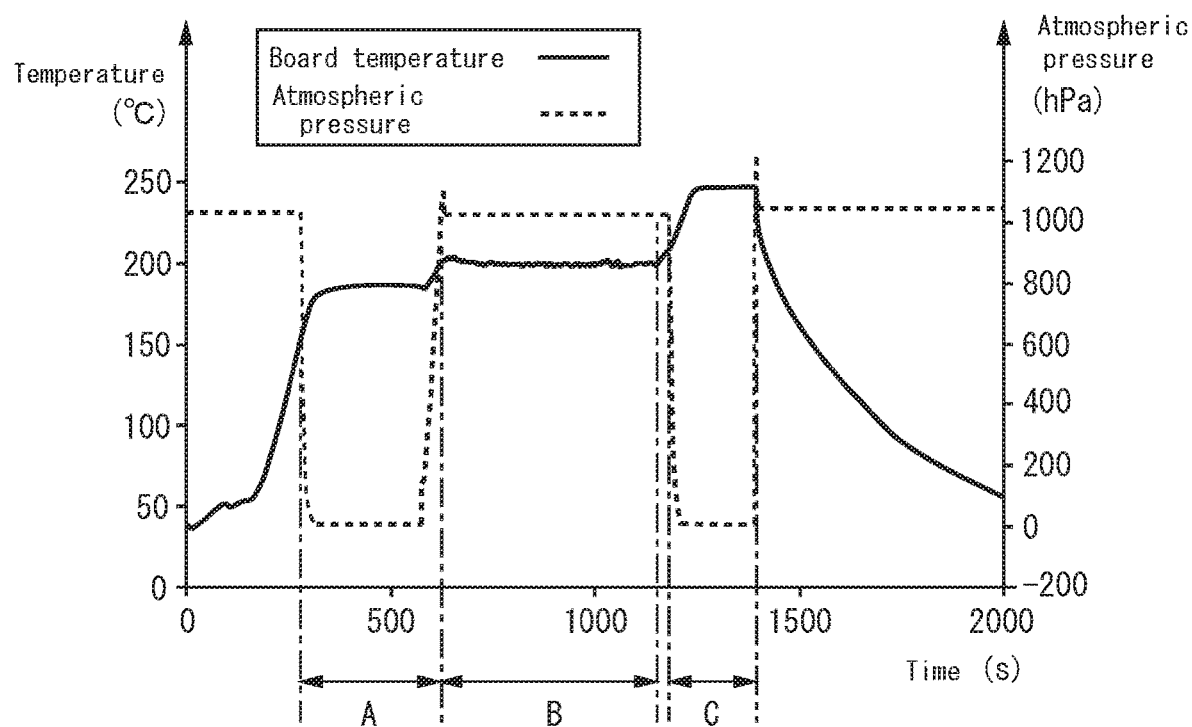
FIG. 2 is a diagram for showing a relationship between temperature and atmospheric pressure in a chamber at the time of reflow.

Next, as shown in FIG. 1B, the printed circuit board 10 with mounted electronic part 30 is conveyed into a chamber of the reflow device 100. As shown in FIG. 2, at the time of pre-heating of the interval A, the chamber is set to be a vacuum state and the temperature of 150 through 180 degrees C. (first temperature). The degree of vacuum is preferably 10 through 100 Pa, for example. Thereby, as shown in FIG. 1C, flux contained in the solder paste 20 completely volatilizes and it is in a residue-free state, and solder powder 22 only remains on the printed circuit board 10 (Second Step). In addition, in the present embodiment, a 'residue-free' state where the flux volatilizes as shown in FIG. 1C means not only the case where the flux completely volatilizes and there is no flux residue at all, but also the case where little of flux residue is seen, or specifically the amount of flux residue is equal to or less than 1 mass % in the flux.

Next, as shown in FIG. 2, in the reducing process of the interval B, formic acid is supplied into the chamber of the reflow device 100, and the chamber state alters from vacuum state to atmospheric pressure state. Additionally, the temperature in the chamber at the time of main heating is set to the temperature (second temperature) which is equal to or higher than the first temperature and lower than the solder melting temperature. Preferably, it is set to the temperature which is lower than the solder melting temperature by 10 through 20 degrees C. Owing to this, formic acid component supplied into the chamber reduces the oxide films formed on the surfaces of the solder or electrodes of the printed circuit board 10, thereby removing the oxide films of the surfaces of the electrodes or solder. That is, the oxide films of the surfaces of electrodes or solder can be removed even with fluxless soldering (Third Step).

Figure 1D:
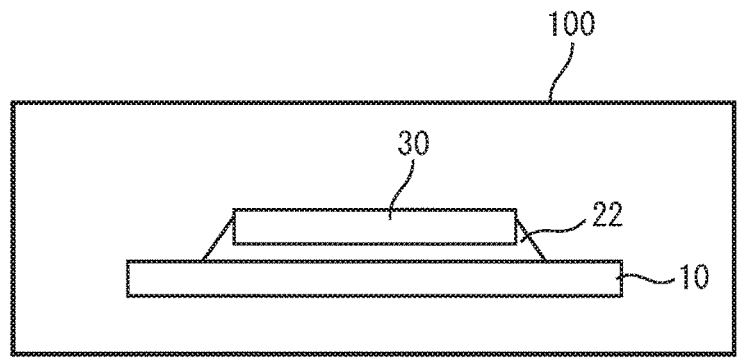
FIG. 1D is a diagram for showing an example of a step in the soldering method according to the embodiment of the present invention.

Next, as shown in FIG. 2, in the main heating of the interval C, the formic acid in the chamber is emitted, and the chamber state alters from the atmospheric pressure state to vacuum state. The degree of vacuum is preferably 10 through 100 Pa, for example. Additionally, the temperature in the chamber at the time of main heating is set to the temperature (third temperature) which is higher than the solder melting temperature by 20 through 50 degrees C., or preferably 20 through 30 degrees C. Thereby, as shown in FIG. 1D, the electronic part 30 is bonded to the electrode of the printed circuit board 10 by melting solder (Fourth Step). Since the flux volatilizes and does not remain at the time of melting solder, the solder scattering is also prevented. In the present embodiment, through such a series of steps, the electronic part 30 is soldered on the printed circuit board 10 via the solder paste 20. [Executed Example]

The following will describe an Executed Example in which, in a case where the reflow was conducted with the changed reflow conditions of temperature, atmospheric pressure and the like in the chamber, the generation of voids, flux residue and solder scattering were respectively examined after the reflow. The reflow device SRO700 manufactured by ATV Technologie Gmbh was used.

At first, solder powder having a composition of Sn-3.0Ag-0.5Cu was manufactured, and solder paste was manufactured by mixing residue-free flux, NRB 60 with the solder powder. Subsequently, the solder paste was applied on a copper plate, and an 8 mm-square Si chip was placed on the solder paste, and then the soldering was conducted with the changed reflow conditions of temperature, atmospheric pressure and the like in the chamber. Finally, the copper plate that the soldering had been conducted on was examined as to the generation of voids and solder scattering after reflow by an x-ray inspection device, and as to flux residue by an electron microscope.

(1) Evaluation Method of Voids

Void rate was measured at the magnification of the 7× of x-ray in the image processing software.

O: indicates that void rate was equal to or less than 1%.

X: indicates that void rate was more than 1%.

(2) Evaluation Method of Soldering

When the soldering was conducted properly, it was evaluated as O, but when the soldering was not conducted properly, it was evaluated as X.

Table 1 shows the evaluation results of the generation of voids, flux residue and solder scattering after reflow under each of the reflow conditions.

TABLE 1

| | Interval A (Pre-heating) | Interval B (Reducing) | Interval C (Main-heating) | FLUX RESIDUE | SOLDER SCATERRING | VOIDS | SOLDERING |
|---|---|---|---|---|---|---|---|
| Executed Example 1 | Pre-heating/ 5 MIN/Vacuum | Formic acid/10 MIN/ Atmosphere | Reflow/3 MIN/ Vacuum | NON-EXISTENCE | NON-EXISTENCE | O | O |
| Comparison Example 1 | Pre-heating/ 5 MIN/ Atmosphere | Formic acid/10 MIN/ Atmosphere | Reflow/3 MIN/ Vacuum | NON-EXISTENCE | EXISTENCE | O | O |
| Comparison Example 2 | Pre-heating/ 5 MIN/Vacuum | Formic acid/1 MIN/ Atmosphere | Reflow/3 MIN/ Vacuum | NON-EXISTENCE | NON-EXISTENCE | O | X |
| Comparison Example 3 | Pre-heating/ 5 MIN/Vacuum | Formic acid/10 MIN/ Atmosphere | Reflow/3 MIN/ Atmosphere | NON-EXISTENCE | NON-EXISTENCE | X | O |

In an Executed Example 1, as shown in Table 1, at the time of pre-heating of the interval A, solder paste was heated in a vacuum state and flux completely volatilized, and therefore flux residue was not observed after reflow. In addition, in the main heating of the interval C, the flux had already volatilized and therefore the solder scattering caused by the flux was also not observed. Further, since the oxide films are removed by formic acid, the soldering can be conducted properly. The generation of voids was not observed at the time of melting solder due to the vacuum state.

Whereas, in a Comparison Example 1, as shown in Table 1, it was impossible for flux to completely volatilize because the vacuum state was not set in the interval A. Hence, when the solder was melted in the interval C, flux remained as voids. After that, the remaining flux volatilized during the main heating and a solder scattering occurred. In a Comparison Example 2, since the reduction of formic acid was conducted for only one minute in the interval B, the oxide film was not sufficiently removed to remain, and it was impossible that the soldering was conducted. In a Comparison Example 3, a vacuum state was not set in the interval C. In addition, the oxide films were removed by formic acid in the interval B, and formic acid remained around solder even when the formic acid supply was stopped, and therefore the formic acid remained as voids at the time of melting solder.

In the embodiments, as described hereinbefore, since the time for pre-heating is set to be longer than before and at the same time, the chamber is set to be a vacuum state, the flux can be completely volatilized at the time of pre-heating, and the solder scattering can be reliably prevented at the time of melting solder. In addition, the fluxless soldering can be conducted because of the reflow in formic acid atmosphere, in this case as well. The reflow was conducted with the use of formic acid, but the reflow may be conducted with a reducing atmosphere by hydrogen or the like. Owing to this, the soldering can be conducted, preventing the solder scattering without voids, and a flux cleaning step can be omitted. Moreover, the flux may not have to include any activator which is necessary for removing oxide films.

In addition, according to the embodiments, since the solder paste 20 is applied on the electrode with the use of the metal mask, the solder powder 22 can be used with any composition, if the solder is in powder form. For example, Sn—Sb based solder, Bi—Sn based solder or the like which is difficult to process to preform can be used. As to the conditions of difficulty processing, tensile strength of solder alloy is equal to or more than 55 MPa, percentage elongation (percentage elongation at break) is equal to or less than 40%, and 0.2% yield strength (offset yield strength) is equal to or more than 40 MPa. Percentage elongation is the property relating to metal processing and smaller percentage elongation is more difficult to molding-process. Each measurement method of the tensile strength, the percentage elongation at break, and the 0.2% yield strength conforms to the Japanese Industrial Standards, JIS Z 2241. The 0.2% yield strength is the load to start the plastic deformation, and when the value thereof is high, the force necessary for processing is increased. The tensile strength is occasionally used as an indicator of the force necessary for the punching process, and when the value thereof is high, the punching process is difficult to carry out. When these requirements are met, solder cannot be spread into a thin layer, or cracks/chippings occur in the punching process. As a solder alloy having such properties are enumerated Sn—Sb based solder alloy having Sb of 10 mass % or more, or Bi—Sn based solder alloy having Bi of 80 mass % or more, for example. In addition, any size of solder paste 20 can be formed accordingly to the shape or size of semiconductor element or electrode, by adjusting the opening dimension and thickness of the metal mask. That is, the solder shape can be flexibly designed even when a solder material having difficulty processing is used.

In addition, the present invention has been described with the use of embodiments, however, the technical scope of the present invention is not limited to the embodiments mentioned above. It is possible to add various changes or improvements to the embodiments mentioned above without departing from the scope of the present invention.

DESCRIPTION OF CODES

10 Printed Circuit Board (Circuit Board)
20 Solder Paste
22 Solder Powder
24 Flux
30 Electronic Part

The invention claimed is:

1. A soldering method characterized in that the soldering method comprises:
　a first step of applying solder paste in which a solder alloy is mixed with residue-free flux to a soldering portion on a circuit board, and mounting an electronic part on the solder paste;
　a second step of volatilizing the residue-free flux contained in the solder paste by heating the circuit board in a furnace set to be a vacuum state and a first temperature to become a residue-free condition, wherein the residue-free condition contains an amount of flux residue that is 1% by weight or less of the flux;
　a third step of removing an oxide film on at least the soldering portion by heating the circuit board in the furnace set to be a reducing atmospheric state and a second temperature; and
　a fourth step of melting solder contained in the solder paste by heating the circuit board in the furnace set to be a vacuum state and a third temperature which is higher than the second temperature.

2. The soldering method according to claim 1 characterized in that in the first step, the solder paste is applied to the soldering portion on the circuit board with the use of a metal mask having an opening that is open at area corresponding to the soldering portion on the circuit board.

3. The soldering method according to claim 1 characterized in that the solder alloy has tensile strength which is equal to or more than 55 MPa, percentage elongation which is equal to or less than 40%, and 0.2% yield strength which is equal to or more than 40 MPa.

4. The soldering method according to claim 2 characterized in that the solder alloy has tensile strength which is equal to or more than 55 MPa, percentage elongation which is equal to or less than 40%, and 0.2% yield strength which is equal to or more than 40 MPa.

* * * * *